(12) United States Patent
Liu

(10) Patent No.: US 6,610,586 B1
(45) Date of Patent: Aug. 26, 2003

(54) METHOD FOR FABRICATING NITRIDE READ-ONLY MEMORY

(75) Inventor: Chen-Chin Liu, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 0 days.

(21) Appl. No.: 10/064,954

(22) Filed: Sep. 4, 2002

(51) Int. Cl.⁷ .............................. H01L 21/8246
(52) U.S. Cl. .................. 438/526; 438/275; 438/297
(58) Field of Search ........................ 438/294, 295, 438/404, 492, 494, 495, 504, 506, 507, 514, 526, 669, 787, 788, 961, FOR 398, FOR 403, 275, 297

(56) References Cited

U.S. PATENT DOCUMENTS

| | | | |
|---|---|---|---|
| 4,113,515 A | * 9/1978 | Kooi et al. | |
| 5,017,515 A | * 5/1991 | Gill | |
| 5,057,451 A | * 10/1991 | McCollum | |
| 5,279,981 A | * 1/1994 | Fukatsu et al. | |
| 6,432,778 B1 | * 8/2002 | Lai et al. | |
| 6,440,798 B1 | * 8/2002 | Lai et al. | |
| 6,448,126 B1 | * 9/2002 | Lai et al. | |
| 6,448,137 B1 | * 9/2002 | Lai et al. | |
| 6,458,642 B1 | * 10/2002 | Yeh et al. | |
| 6,468,864 B1 | * 10/2002 | Sung et al. | |
| 6,469,342 B1 | * 10/2002 | Kuo et al. | |
| 2002/0151138 A1 | * 10/2002 | Liu | |
| 2002/0177275 A1 | * 11/2002 | Liu et al. | |

* cited by examiner

Primary Examiner—George Fourson
Assistant Examiner—Joannie Adelle Garcia
(74) Attorney, Agent, or Firm—Jianq Chyun IP Office

(57) ABSTRACT

A method for fabricating an NROM is described. A stacked nitride layer is formed on a substrate and then patterned to expose a portion of the substrate. An implantation is performed to form a buried bit line in the exposed substrate, and then an oxide layer is formed on the buried bit line by using wet oxidation. Thereafter, a gate oxide layer is formed in the periphery circuit region by using dry oxidation. A patterned polycide layer is formed on the substrate covering the stacked nitride layer and then patterned into a word line of the NROM cell and a gate of a periphery device.

11 Claims, 3 Drawing Sheets

METHOD FOR FABRICATING NITRIDE READ-ONLY MEMORY

BACKGROUND OF INVENTION

1. Field of Invention

The present invention relates to a method for fabricating a read-only memory (ROM). More particularly, the present invention relates to a method for fabricating a nitride read-only memory (NROM).

2. Description of Related Art

In a method for fabricating an NROM cell in the prior art, a stacked ONO layer is formed on a substrate and then patterned to expose a portion of the substrate. A first oxidation process is then conducted to form a buried drain (BD) oxide layer on the exposed substrate. A first implantation is performed to form a buried bit line in the substrate under the BD oxide layer. A second implantation is performed to form a junction region in the substrate around the joint of the patterned ONO layer and the BD oxide layer, and then a polysilicon word line is formed on the substrate crossing over the stacked ONO layer. Generally, the fabrication of NROM cells is integrated with those of periphery devices, wherein a second oxidation process is conducted after the second implantation to form gate oxide in the periphery circuit region.

In the prior art, the BD oxide layer and the gate oxide layer both are formed either by using wet oxidation or by using dry oxidation. However, when dry oxidation is used to form the BD oxide layer and the gate oxide layer, the integrity of the BD oxide layer is lower. When wet oxidation is used, the dopants in the gates of the MOS transistors in the periphery circuit region easily diffuse into the under channels since the gate oxide layer formed thereby has a higher porosity. Therefore, the dopant concentrations in the channels are compensated, and the threshold voltage of the channel shifts correspondingly.

SUMMARY OF INVENTION

Accordingly, this invention provides a method for fabricating a nitride read-only memory (NROM) to improve the integrity of the BD oxide layer.

This invention also provides a method for fabricating an NROM to maintain the dopant concentrations in the channels of the MOS transistors in the periphery circuit region, so as to prevent the threshold voltages of the MOS transistors from shifting.

A method for fabricating a NROM of this invention comprises the following steps. A stacked nitride layer is formed on a substrate and then patterned to expose a portion of the substrate. An implantation is performed to form a buried bit line in the exposed substrate, and a buried drain (BD) oxide layer is formed on the buried bit line by using wet oxidation. A tilt implantation is then performed to form a junction region in the substrate around the joint of the stacked nitride layer and the BD oxide layer. Thereafter, a gate oxide layer is formed on a periphery device region by using dry oxidation. A polycide layer, which consists of a polysilicon layer and a metal silicide layer, is formed on the substrate covering the stacked nitride layer and then patterned into a word line and a gate of the periphery device.

In another method for fabricating an NROM of this invention, the step of patterning the stacked nitride layer is stopped as a bottom layer of the stacked nitride layer is exposed. The exposed bottom layer is not removed until the bit line implantation is finished in order to avoid channeling effect during the bit line implantation.

In this invention, the BD oxide layer is formed on the buried bit line by using wet oxidation, so the integrity of the BD oxide layer can be improved. Meanwhile, the gate oxide layer is formed on the substrate by using dry oxidation, so the dopant concentrations in the channels of the MOS transistors in the periphery circuit region are not changed, and the threshold voltages of the MOS transistors do not shift. Besides, if the bottom layer of the stacked nitride layer is not patterned until the bit line implantation is finished, channeling effect can be avoided during the bit line implantation.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

First Embodiment

Figure 1:
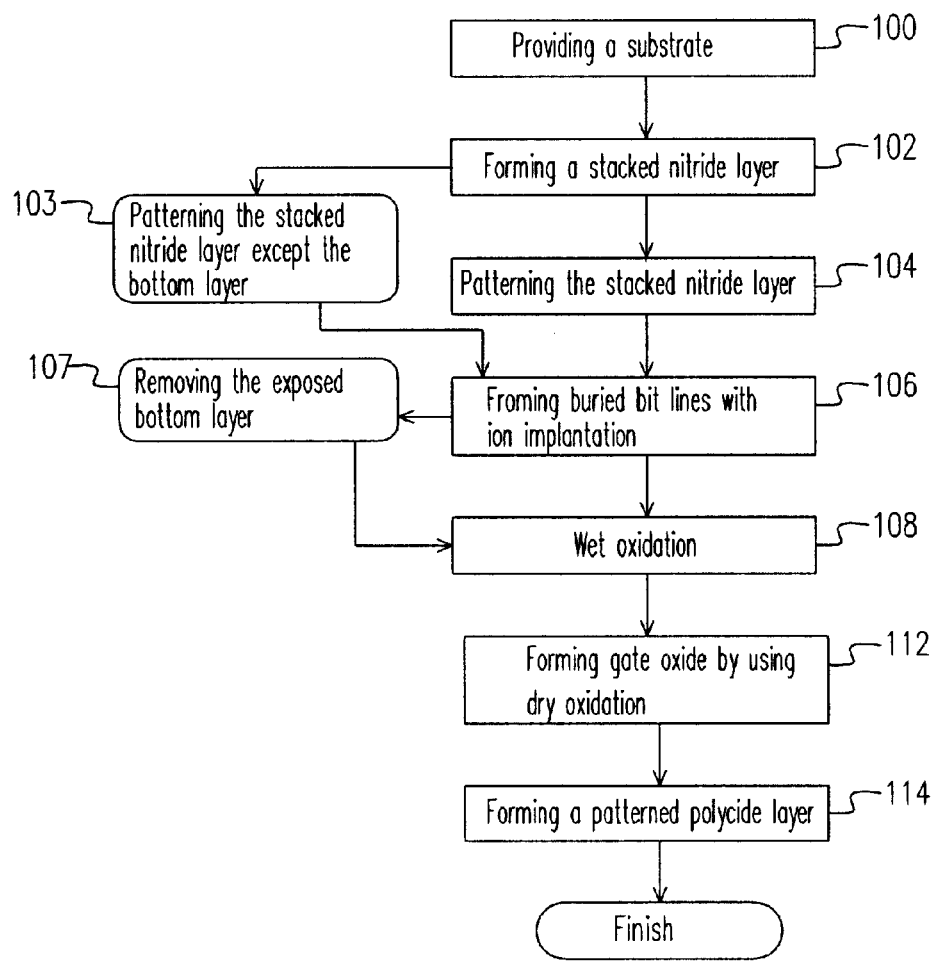
FIG. 1 illustrates the process flowchart of fabricating a NROM according to a first embodiment of this invention.

FIG. 1 illustrates the process flowchart of fabricating a NROM according to the first embodiment of this invention. The fabricating processes of NROM cells and periphery devices are integrated in this process.

Refer to FIG. 1, a substrate is provided in step 100. The substrate comprises, for example, a semiconductor material like silicon. A stacked nitride layer, such as an oxide/nitride/oxide (ONO) composite layer, is formed on the substrate in step 102. The ONO composite layer consists of a bottom oxide layer, a nitride layer and a top oxide layer having thickness of 50–100 Å, 20–50 Å and 50–100 Å, respectively. The top oxide layer is formed by oxidizing a portion of the nitride layer with wet $H_2/O_2$ gas, while some nitrogen diffuse into the bottom oxide interface during the long-time wet oxidation process to cause Kooi effect.

The stacked nitride layer is patterned into a plurality of stacked nitride strips in step 104, wherein the stacked nitride strips expose a portion of the substrate and serve as the gate dielectrics of the NROM cells. Alternatively, the stacked nitride layer is patterned except the bottom layer directly on the substrate in step 103 in order to avoid channeling effect in the subsequent bit line implantation.

Thereafter, an ion implantation is performed to form a plurality of buried bit lines in the substrate between the stacked nitride strips in step 106. If the bottom layer still remains between stacked nitride strips because step 103 is performed instead of step 104, an etching step 107 is further conducted to remove the exposed bottom layer after the bit line implantation.

Buried drain (BD) oxide layers are then formed on the buried bit lines by using wet oxidation in step 108. The BD oxide layers are not formed with dry oxidation because the Kooi effect would cause a smaller thickness around the edge of the BD oxide layer, and the word lines and the substrate might be short-circuited because of breakdown of the edge BD oxide. Since wet oxidation can eliminate the Kooi effect and has better encroachment effect for the BD oxide layer, the integrity of the BD oxide layers can be improved.

A gate oxide layer is formed in the periphery circuit region by using dry oxidation in step 112. Since dry oxidation is used to form the gate oxide layer, the dopant concentrations in the channels of the MOS transistors in the periphery circuit region are not changed, and the threshold voltages of the MOS transistors do not shift. It is noted that the periphery circuit region is protected by a mask layer thereon in the fabricating process of the NROM cells before step 112, wherein the mask layer comprises, for example, a stacked nitride layer retained in the step of defining the stacked nitride strips.

Then, in step 114, a polycide layer comprising a polysilicon layer and a metal silicide layer is formed on the substrate and then patterned into the word lines of the NROM cells and the gate electrodes of the periphery devices.

Second Embodiment

FIGS. 2A~2D illustrate a process flow of fabricating NROM cells according to the second embodiment of this invention in a cross-sectional view. The fabricating processes of NROM cells and periphery devices are integrated in this process.

Figure 2A:
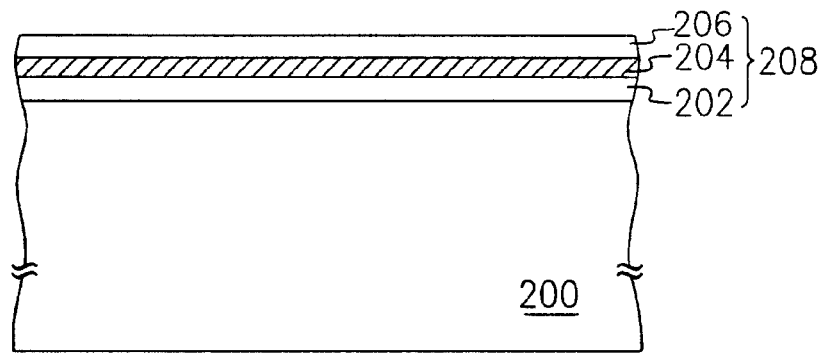
FIGS. 2A–2D illustrate a process flow of fabricating NROM cells according to a second embodiment of this invention in a cross-sectional view.

Refer to FIG. 2A, a stacked nitride layer 208, such as an oxide/nitride/oxide (ONO) composite layer, is formed on a substrate 200. The ONO composite layer comprises a bottom oxide layer 202, a silicon nitride layer 204 and a top oxide layer 206, wherein each of the bottom and the top oxide layers 202 and 206 has a thickness of 50~100 Å, and the thickness of the silicon nitride layer 204 is 20~50 Å. The top oxide layer 206 is formed by oxidizing a portion of the silicon nitride layer 204 with wet $H_2/O_2$ gas, while some nitrogen diffuse into the interface of the bottom oxide layer 202 during the long-time wet oxidation process to cause Kooi effect.

Figure 2B:
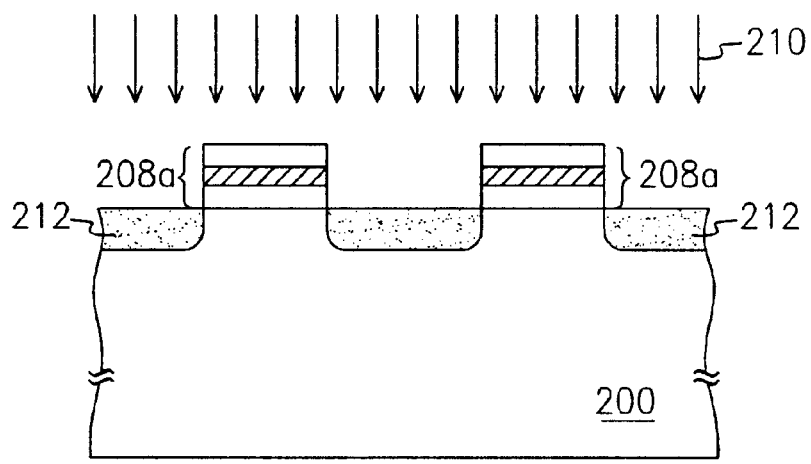

Refer to FIG. 2B, the stacked nitride layer 208 is patterned into a plurality of stacked nitride strips 208a, which expose a portion of the substrate 200 and serve as the gate dielectrics of the NROM cells. Thereafter, an ion implantation 210 is performed to form a plurality of buried bit line 212 in the substrate 200 between the stacked nitride strips 208a. In the step of patterning the stacked nitride layer 208, however, the exposed bottom oxide layer 202 may be retained in order to prevent channeling effect in the subsequent bit line implantation. If the bottom oxide layer 202 is not patterned in the step of defining the stacked nitride strips 208a, the exposed bottom oxide layer 202 is removed after the bit line implantation.

Figure 2C:
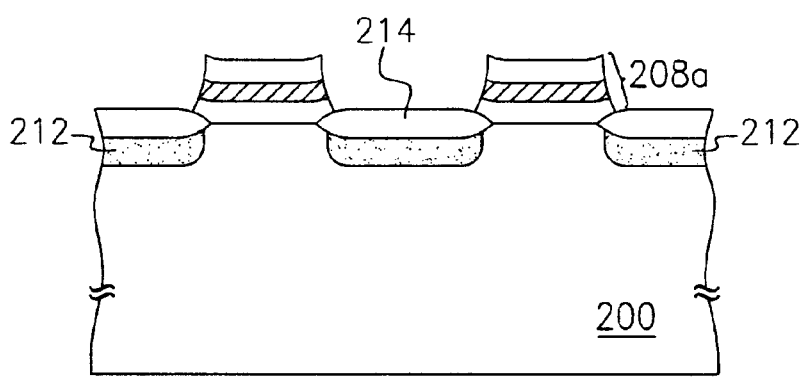

Refer to FIG. 2C, buried drain (BD) oxide layers 214 are formed on the buried bit lines 212 by using wet oxidation. Since wet oxidation can eliminate the bottom oxide Kooi effect and has better encroachment effect for the BD oxide layers 214, excellent integrity of the BD oxide layers 214 can be achieved.

Next, a gate oxide layer 220 is formed in the periphery circuit region (not shown) by using dry oxidation, wherein a thin oxide layer 220 is simultaneously formed on the BD oxide layer 214. Since dry oxidation is used to form the gate oxide layer, the gate oxide layer has a lower porosity and the dopant concentrations in the channels of the MOS transistors in the periphery circuit region are not changed, and the threshold voltages of the MOS transistors do not shift.

Figure 2D:
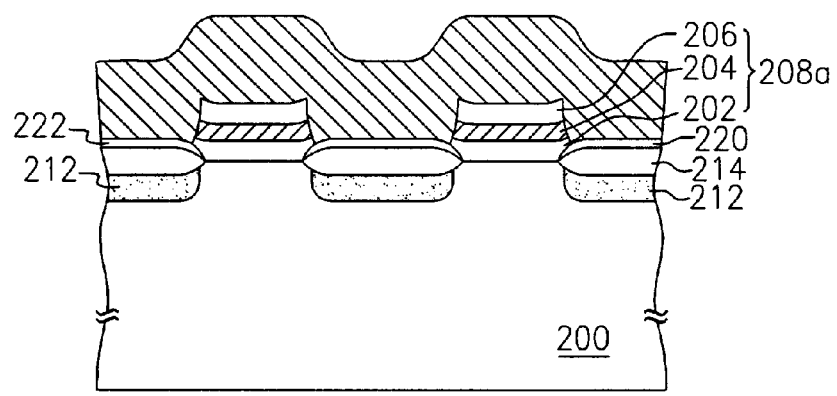

Refer to FIG. 2D, a conductive layer, such as a tungsten silicide ($WSi_x$) layer, is formed on the substrate 200, and then patterned into the word lines 222 of the NROM cells and the gate electrodes of the periphery devices (not shown).

It is noted that the BD oxide layers 214 are preferably not formed with dry oxidation since the bottom oxide Kooi effect causes a smaller thickness around the edge of the BD oxide layer and the encroachment effect for the BD oxide layer is worse in the dry oxidation process. Thereofre, the thickness of the edge BD oxide is small, and the word lines and the substrate might be short-circuited to result in reliability issues because of breakdown of the edge BD oxide.

As mentioned above, the BD oxide layers are formed on the buried bit line by using wet oxidation in this invention, so the integrity of the BD oxide layers can be improved. Meanwhile, the gate oxide layer is formed on the substrate by using dry oxidation, so the dopant concentrations in the channels of the MOS transistors in the periphery circuit region are not changed, and the threshold voltages of the MOS transistors do not shift. Besides, if the bottom oxide layer of the stacked nitride layer is not patterned until the bit line implantation is finished, channeling effect can be avoided during the bit line implantation.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a nitride read-only memory (NROM), comprising:

forming a stacked nitride layer on a substrate;

patterning the stacked nitride layer to expose a portion of the substrate;

performing an ion implantation to form a buried bit line in the exposed substrate;

using wet oxidation to form an oxide layer on the buried bit line;

using dry oxidation to form a gate oxide layer in a periphery device region; and forming a patterned conductive layer on the substrate, wherein the patterned conductive layer constitutes a word line and a gate of the periphery device region.

2. The method of claim 1, wherein the stacked nitride layer comprises a bottom oxide layer, a silicon nitride layer and a top oxide layer.

3. The method of claim 2, wherein the bottom oxide layer has a thickness of 50~100 Å.

4. The method of claim 2, wherein the silicon nitride layer has a thickness of 20~50 Å.

5. The method of claim 2, wherein the top oxide layer has a thickness of 50~100 Å.

6. The method of claim 1, wherein the conductive layer comprises a polycide layer consisting of a polysilicon layer and a metal silicide layer.

7. A method for fabricating a nitride read-only memory (NROM), comprising:

forming a stacked nitride layer on a substrate, wherein the stacked nitride layer comprises a bottom oxide layer, a silicon nitride layer and a top oxide layer;

patterning the stacked nitride layer except the bottom oxide layer to form a trench;

performing an ion implantation to form a buried bit line in the substrate under the trench;

removing the bottom oxide layer under the trench;

using wet oxidation to form an oxide layer on the buried bit line;

using dry oxidation to form a gate oxide layer in a periphery device region; and forming a patterned conductive layer on the substrate, wherein the patterned conductive layer constitutes a word line and a gate of the periphery device region.

8. The method of claim 7, wherein the bottom oxide layer has a thickness of 50~100 Å.

9. The method of claim 7, wherein the silicon nitride layer has a thickness of 20~50 Å.

10. The method of claim 7, wherein the top oxide layer has a thickness of 50~100 Å.

11. The method of claim 7, wherein the conductive layer comprises a polycide layer consisting of a polysilicon layer and a metal silicide layer.

* * * * *